United States Patent [19]
Ngo et al.

[11] Patent Number: 6,127,261
[45] Date of Patent: Oct. 3, 2000

[54] METHOD OF FABRICATING AN INTEGRATED CIRCUIT INCLUDING A TRI-LAYER PRE-METAL INTERLAYER DIELECTRIC COMPATIBLE WITH ADVANCED CMOS TECHNOLOGIES

[75] Inventors: Minh Van Ngo, Union City; Darin A. Chan, Campbell, both of Calif.

[73] Assignee: Advanced Micro Devices, Inc., Sunnyvale, Calif.

[21] Appl. No.: 08/559,054

[22] Filed: Nov. 16, 1995

[51] Int. Cl.$^7$ ................................................ H01L 21/316
[52] U.S. Cl. .................................. 438/633; 438/699
[58] Field of Search ........................ 437/235, 238; 156/636.1; 438/699, 763, 905, 906, 633, 913; 427/579, 573; 148/DIG. 118

[56] References Cited

U.S. PATENT DOCUMENTS

| | | | |
|---|---|---|---|
| 4,394,401 | 7/1983 | Shioya et al. | 427/39 |
| 4,791,071 | 12/1988 | Ang | 437/42 |
| 4,877,641 | 10/1989 | Dory | 427/38 |
| 5,041,311 | 8/1991 | Tsukune et al. | 427/255.3 |
| 5,068,124 | 11/1991 | Batey et al. | 427/39 |
| 5,275,963 | 1/1994 | Cederbaum et al. . | |
| 5,284,789 | 2/1994 | Mori et al. | 437/113 |
| 5,405,710 | 4/1995 | Dodabalapur et al. | 428/690 |
| 5,464,794 | 11/1995 | Lur et al. . | |
| 5,482,749 | 1/1996 | Telford et al. | 427/578 |
| 5,508,534 | 4/1996 | Nakamura et al. . | |
| 5,510,652 | 4/1996 | Burke et al. . | |
| 5,560,802 | 10/1996 | Chisholm | 156/636.1 |
| 5,578,860 | 11/1996 | Costa et al. | 257/528 |
| 5,583,360 | 12/1996 | Roth et al. | 257/316 |
| 5,627,403 | 5/1997 | Bacchetta et al. . | |
| 5,635,417 | 6/1997 | Natsume | 438/130 |
| 5,736,423 | 4/1998 | Ngo | 437/238 |

FOREIGN PATENT DOCUMENTS

| | | |
|---|---|---|
| 0485086 | 5/1992 | European Pat. Off. . |
| 6045313 | 2/1994 | Japan . |

OTHER PUBLICATIONS

Wolf, Stanley, Silicon Processing for the VLSI Era, vol. 2, pp. 198–199, 1990.

Lee, Hong H., Fundamentals of microelectronics processing, pp. 394–395, 420–424, 449, 1990.

S. Wolf et al. Silicon Processing for the VLSI Era. vol. 1, p. 164, 514, 1986.

S. Wolf et al. Silicon Processing for the VLSI Era, vol. 2, p. 226, 238–239, 1990.

M.K. Jain et al. "Chemical Mechanical Planarization of Multilayer Dielectric Stacks", SPIE: Microelectronics Technology and Process Integration, Oct. 20–21, 1994, Austin, Texas, pp. 2–1, XP002019336.

"SI Precoat of PECVD Chamber Walls Prior to the Formation of a Thin SI Layer on Gas or III–V Compounds", Research Disclosure, No. 325, May 1, 1991, p. 367 XP000229723.

*Primary Examiner*—Charles Bowers
*Assistant Examiner*—Matthew Whipple
*Attorney, Agent, or Firm*—Skjerven, Morrill, MacPherson, Franklin & Friel LLP; Ken J. Koestner

[57] ABSTRACT

A method of depositing a premetal dielectric layer involves deposition of a triple premetal dielectric layer in in-situ deposition in a single fabrication tool with each subsequent layer being deposited after a previous layer with no intervening handling step. Thus, no intervening cleaning steps or other intermediate steps are performed.

24 Claims, 2 Drawing Sheets

6,127,261

METHOD OF FABRICATING AN INTEGRATED CIRCUIT INCLUDING A TRI-LAYER PRE-METAL INTERLAYER DIELECTRIC COMPATIBLE WITH ADVANCED CMOS TECHNOLOGIES

FIELD OF THE INVENTION

This invention relates to the field of integrated circuit fabrication methods and, more specifically, to integrated circuit fabrication methods for depositing a premetal interlayer dielectric.

BACKGROUND OF THE INVENTION

Fabrication of semiconductor devices involves the application of numerous fabrication steps. Each of the fabrication steps extracts a cost in terms of time and handling. Generally, a process that involves fewer handling steps generally produces electronic devices at a much lower cost than a process that produces the same quality devices using more handling steps.

Each structure in a semiconductor device is produced by a series of fabrication steps. One such structure is a premetal interlayer dielectric deposition. A premetal interlayer dielectric is a dielectric layer that is typically formed between polysilicon and a metal interconnect layer so that all of the devices underlying the metal interconnect layer are electrically isolated.

A conventional process for forming a premetal interlayer dielectric on a semiconductor wafer requires many fabrication steps. These steps include a low temperature oxidation deposition step to form a barrier layer and cleaning operation prior to low temperature oxidation. The cleaning operation is performed in a different tool (a sink) than the low temperature oxidation tool (a furnace). Following the low temperature oxidation, the wafer is again removed from the furnace for cleaning. After cleaning, a boron-phosphorous TEOS deposition is performed in a PECVD reactor to form a second layer of oxide film. Densification of the two-layer film is achieved by thermal cycling in a furnace. Densification reflows the oxide at elevated temperatures and results in some planarization of the surface of the semiconductor wafer. Following densification, the wafer is again cleaned. The wafer is then inspected for $BPO_4$ crystal defects that may occur in densification. The wafer is then etched back in a reactor to give the final form of the premetal interlayer dielectric. The many steps used in this process result in an increase in fabrication costs.

What is needed is a method for depositing a premetal interlayer dielectric that greatly reduces handling steps and thus reduces fabrication costs.

SUMMARY OF THE INVENTION

In accordance with the present invention, a method of depositing a premetal dielectric layer involves deposition of a triple premetal dielectric layer in insitu deposition in a single fabrication tool with each subsequent layer being deposited after a previous layer with no intervening handling step. Thus, no intervening cleaning steps or other intermediate steps are performed.

Several advantages are achieved by the described method. One advantage is that thermal cycling at high temperatures is not employed in the disclosed method. Many advanced technology devices utilize silicided gates and structures. A silicide film is not stable at high temperatures so that thermal cycling during densification damages the silicide, causing agglomeration of atoms within the silicide and raising the resistivity in the circuit. Low resistivity is a desired trait of silicides. In the disclosed method, the temperature does not exceed 800 degrees Celsius so that titanium silicide structures are not damaged.

Another advantage of the disclosed method is that the defect rate of fabricated devices is very low due to the reduction in handling. A further advantage of the method that results from the reduced handling is a substantially reduced manufacturing cost.

BRIEF DESCRIPTION OF THE DRAWINGS

The features of the invention believed to be novel are specifically set forth in the appended claims. However, the invention itself, both as to its structure and method of operation, may best be understood by referring to the following description and accompanying drawings.

DETAILED DESCRIPTION

Figure 1:
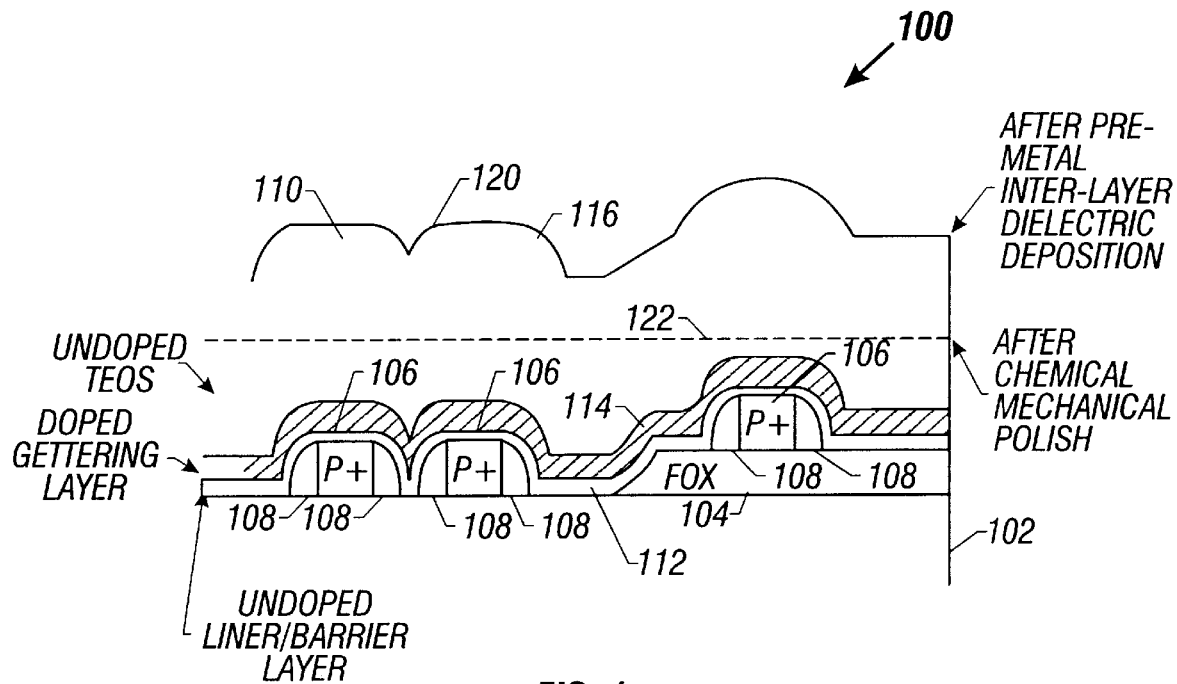
FIG. 1 is a cross-sectional view of an integrated circuit wafer showing an example of a trilayer premetal interlayer dielectric.

Referring to FIG. 1, a cross-sectional view of an integrated circuit 100 shows an example of a trilayer premetal interlayer dielectric deposition. The integrated circuit 100 includes a silicon substrate 102. A field oxide region 104 is formed on one side of the substrate 102 and is used to isolate devices within the substrate 102. A plurality of polysilicon gates 106 are formed overlying the substrate 102. The polysilicon gates 106 have oxide spacers 108 for implantation of structures such as lightly-doped drain (LDD) structures. A tri-layer premetal dielectric 110 overlies the surface of the substrate 102. The three layers of the tri-layer premetal dielectric 110 include an undoped liner/barrier layer 112, a doped gettering layer 114 and an undoped TEOS layer 116. A solid line 120 shows the surface of the integrated circuit 100 overlying the tri-layer premetal dielectric 110 after deposition of the tri-layer but before any etching or polishing. A dotted line 122 shows the surface of the integrated circuit 100 overlying the tri-layer premetal dielectric 110 after chemical mechanical polishing.

The doped gettering layer 114 has a thickness of approximately 3000 angstroms. The doped gettering layer 114 is employed to attract and hold electrons and holes and to prevent the electrons and holes from migrating and affecting transistor performance. Otherwise, these electrons and holes may act to create leakage currents, shift threshold voltages and the like. The undoped liner/barrier layer 112 is used to chemically isolate the doped gettering layer 114 from the polysilicon gates 106. Polysilicon gates 106 often are P+ type doped, for example with boron. Phosphorus in the doped gettering layer 114 would act as an antidopant to the boron of the polysilicon gates 106 so that the undoped liner/barrier layer 112 is provided to prevent counter doping of the boron by the phosphorus. The undoped liner/barrier layer 112 has a thickness of approximately 500 angstroms.

The undoped TEOS layer 116 is utilized to fill any voids in the surface of the doped gettering layer 114. The undoped TEOS layer 116 fills voids caused by structures such as the polysilicon gates 106 and the field oxide region 104. The undoped TEOS layer 116 also adds thickness to the surface of the integrated circuit so that all structures, even prominent structures overlying both the field oxide region 104 and the polysilicon gate 106. The undoped TEOS layer 116 has a thickness of approximately 10200 angstroms. The total thickness of the trilayer premetal dielectric 110 is approximately 13700 angstroms with a standard deviation of approximately 200 angstroms and a final thickness after polishing of about 4000 angstroms.

Figure 2:
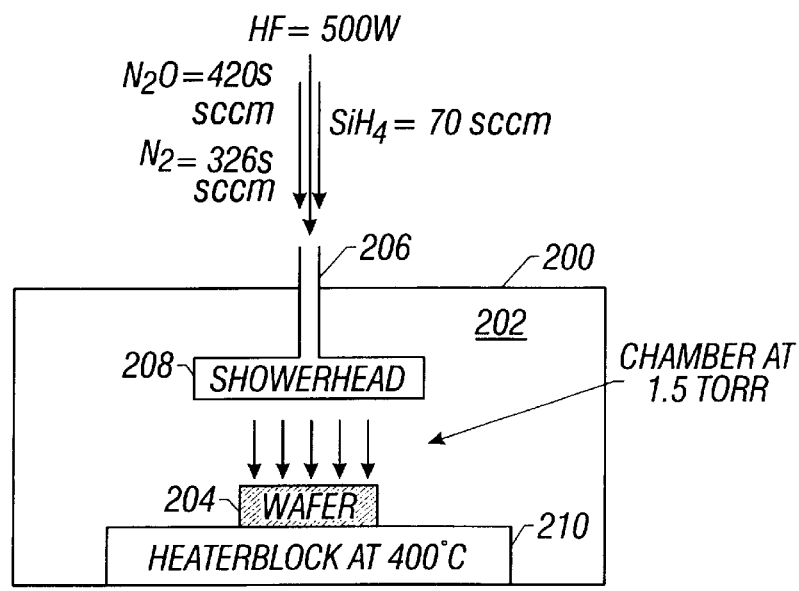
FIG. 2 is a pictorial representation of a PECVD reactor for depositing a tri-layer premetal interlayer dielectric in accordance with one embodiment of the preset invention.

Referring to FIG. 2, a PECVD reactor 200 for depositing a trilayer premetal dielectric is shown. In one embodiment of the method, a NOVELLUS CONCEPT 1 (TM) PECVD reactor 200 is used to the trilayer premetal dielectric in a silane ($SiH_4$)-based system. In this embodiment, reactant gases include silane ($SiH_4$), nitrous oxide ($N_2O$), molecular nitrogen ($N_2$), molecular oxygen ($O_2$) and TEOS.

The reactor 200 includes a chamber 202 holding a wafer 204, an in-flow tube 206 for carrying reactant gases to the chamber 202, a shower head 208 for applying the reactant gases to the chamber 202. A heater block 210 heats the wafer 204 and also supports the wafer 204 during processing.

Figure 3:
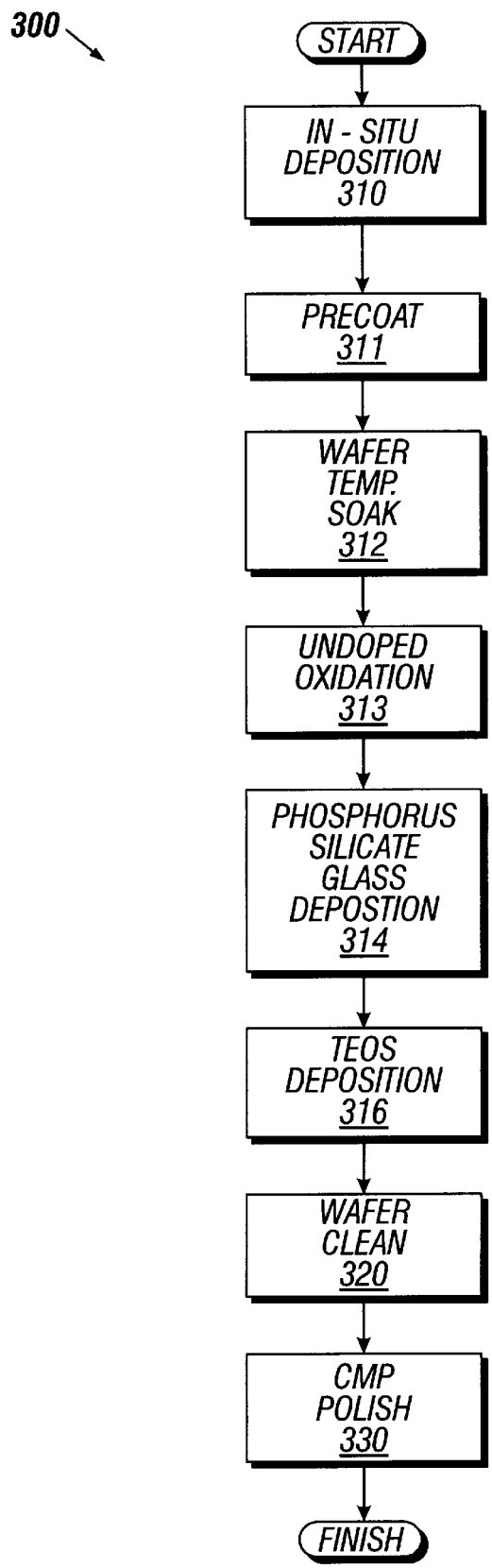
FIG. 3 is a flow chart which illustrates steps of method for depositing a trilayer premetal interlayer dielectric in accordance with the present invention.

Referring to FIG. 3, a flow chart illustrates steps of a method 300 for depositing a tri-layer premetal interlayer dielectric using in-situ deposition. The in-situ deposition method 300 includes a triple layer in-situ deposition step 310. The triple layer in-situ deposition step 310 has five substeps including a precoat step 311, a wafer temperature soak step 312, an undoped oxidation step 313, a phosphorus silicate glass deposition step 314 and a TEOS deposition step 316. All of the substeps of the triple layer in-situ deposition step 310 take place in sequence in a single PECVD reactor so that no handling of semiconductor wafer occurs between any substeps. This reduction in handling results in a very low defect rate. Also, in the in-situ deposition step 310, the semiconductor wafer is continually kept under vacuum. Because the wafer is kept under vacuum, cleaning between deposition of the constituent layers is not necessary.

Following the in-situ deposition step 310, the wafer is cleaned in wafer clean step 320 using standard wafer cleaning techniques that are well known in the art. Subsequent to the wafer clean step 320, chemical mechanical polish (CMP) step 330 polishes the wafer to attain a substantially flat surface by removing a portion of the TEOS layer 116. CMP step 330 employs a conventional chemical mechanical polish operation as is known in the art of semiconductor fabrication.

The precoat step 311 which occurs for a specified precoat time, as is known in the PECVD art, is employed for chamber seasoning. During the precoat step 311 operation, the wafer 204 is held outside the reactor 200 while reactant gases are applied to the chamber 202. The precoat step 311 coats the interior surfaces of the reactor 200. In precoat step 311, precoating is done for each of the undoped oxidation step 313, the phosphorus silicate glass deposition step 314 and the TEOS deposition step 316. Thus, while the wafer is outside the reactor 200, the reactant flows, power, pressure and temperature for each of the three deposition substeps is applied to the reactor 200 for a specified time. In one embodiment using the NOVELLUS CONCEPT 1 (TM) PECVD reactor, the precoat time for each deposition substep is 240 seconds. For example, the reactant flows, pressure, power and temperature utilized in undoped oxidation step 313 is first applied to the reactor 200 for 240 seconds. Then the reactant flows, pressure, power and temperature utilized in phosphorus silicate glass deposition step 314 is applied to the reactor 200 for 240 seconds. Finally, the reactant flows, pressure, power and temperature utilized in TEOS deposition step 316 is applied to the reactor 200 for 240 seconds.

Following the precoat step 311, a wafer temperature soak operation as is known in the PECVD art, is applied in soak step 312. During the soak operation, a cold wafer 204 from outside the reactor 200 is placed into the chamber 202 and heated on the heater block 210 before reactant gases, power and pressure are applied to the chamber 202. A typical soak time using the NOVELLUS CONCEPT 1 (TM) PECVD reactor is approximately 60 seconds.

In the undoped oxidation step 313, the reactants including silane ($SiH_4$), nitrous oxide ($N_2O$) and molecular nitrogen ($N_2$) are applied by a flow into the chamber 202 at a selected pressure and RF power. In an embodiment of the present invention using the NOVELLUS CONCEPT 1 (TM) PECVD reactor to fabricate wafers, the silane ($SiH_4$) flow rate is approximately 200 sccm, although flow rates from 190 sccm to 210 sccm are suitable. The nitrous oxide ($N_2O$) flow rate is approximately 6000 sccm, although flow rates from 5700 sccm to 6300 sccm are suitable. A nitrogen ($N_2$) flow rate is approximately 3150 sccm although flow rates from 3000 sccm to 3300 sccm are suitable. High frequency power applied at approximately 600 watts and low frequency power at approximately 400 watts although wattages that vary from these values by plus or minus five percent are also suitable. Pressure is applied at about 2.2 torr although pressures from 2.0 torr to 2.4 torr are suitable. The deposition temperature is about 400 degrees Celsius. Deposition is applied for multiple seconds.

In phosphorus silicate glass deposition step 314, the reactants including silane ($SiH_4$), phosphene ($PH_3$), nitrous oxide ($N_2O$) and molecular nitrogen ($N_2$) are applied by a flow into the chamber 202 at a selected pressure and RF power. In an embodiment of the present invention using the NOVELLUS CONCEPT 1 (TM) PECVD reactor to fabricate wafers, the silane ($SiH_4$) flow rate is approximately 200 sccm, although flow rates from 190 sccm to 210 sccm are suitable. The phosphene ($PH_3$) flow rate is approximately 320 sccm, although flow rates from 305 sccm to 335 sccm are suitable. The nitrous oxide ($N_2O$) flow rate is approximately 6000 sccm, although flow rates from 5700 sccm to 6300 sccm are suitable. A nitrogen ($N_2$) flow rate is approximately 2700 sccm, although flow rates from 2550 sccm to 2850 scam are suitable. High frequency power applied at approximately 600 watts and low frequency power at approximately 400 watts although wattages that vary from these values by plus or minus five percent are also suitable. Pressure is applied at about 2.4 torr although pressures from 2.0 torr to 2.2 torr are suitable. The deposition temperature is about 400 degrees Celsius. Deposition is applied for multiple seconds.

In TEOS deposition step 316, the reactants including TEOS and molecular oxygen ($O_2$) are applied by a flow into the chamber 202 at a selected pressure and RF power. In an embodiment of the present invention using the NOVELLUS CONCEPT 1 (TM) PECVD reactor to fabricate wafers, the TEOS flow rate is approximately 1.8 ml/min, although flow rates from 1.6 ml/min to 2.0 ml/min are suitable. The oxygen ($O_2$) flow rate is approximately 6500 sccm, although flow rates from 6200 scam to 6800 scam are suitable. High frequency power applied at approximately 650 watts and low frequency power at approximately 350 watts although wattages that vary from these values by plus or minus five percent are also suitable. Pressure is applied at about 2.2 torr although pressures from 2.0 torr to 2.4 torr are suitable. The deposition temperature is about 400 degrees Celsius. Typically deposition is applied for approximately one minute, although exact timing is not critical.

The description of certain embodiments of this invention is intended to be illustrative and not limiting. Numerous other embodiments will be apparent to those skilled in the art, all of which are included within the broad scope of this invention. For example, A thin layer of silicon is grown by PECVD $SiO_2$ deposition using Silane ($SiH_4$) as the silicon source. In other embodiments of the fabrication method, other sources of silicon may be employed, including silicon tetrachloride ($SiCl_4$), trichlorosilane ($SiHCl_3$) or dichlorosilane ($SiH_2Cl_2$) Silane and dichorosilane are typically used for depositing relatively thin silicon epitaxial layers and for depositing epitaxial layers at a relatively low temperature.

What is claimed is:

1. A method of depositing a premetal interlayer dielectric on a semiconductor substrate using a PECVD reactor comprising:
   precoating an inner surface of the PECVD reactor;
   wafer temperature soaking the semiconductor substrate;
   depositing a plurality of layers of a premetal dielectric layer in in-situ deposition upon the semiconductor substrate using the PECVD reactor with each subsequent layer being deposited after a previous layer with no intervening handling, depositing the plurality of layers including:
      depositing an undoped silane-based oxide layer;
      depositing a phosphorus silicate glass layer; and
      depositing a TEOS-based oxide layer;
   cleaning the semiconductor substrate following deposition of the plurality of layers; and
   chemical mechanical polishing the TEOS-based oxide layer without exposing the doped silane-based oxide following the cleaning.

2. A method of depositing a premetal interlayer dielectric on a substrate comprising:
   precoating an inner surface of a chemical vapor deposition chamber;
   placing the substrate into the chemical vapor deposition chamber;
   wafer temperature soaking the substrate;
   depositing a plurality of selected-composition dielectric layers on the substrate insitu in the chemical vapor deposition chamber, the operation of depositing individual selected-composition dielectric layers including:
      injecting selected reactants into the chemical vapor deposition chamber at a controlled flow rate, pressure, temperature, and RF power, injecting the reactants for a controlled duration at the end of which a subsequent selected-composition dielectric layer is deposited without removal of the substrate from the chemical vapor deposition chamber, the reactants being injected to deposit a plurality of layers including:
         depositing an undoped liner/barrier layer;
         depositing a doped Bettering layer; and
         depositing an undoped TEOS-based oxide layer;
   removing the substrate from the chemical vapor deposition chamber;
   cleaning the removed substrate; and
   chemical mechanical polishing the cleaned substrate, polishing the TEOS-based oxide laver without exposing the doped gettering layer.

3. A method according to claim 2 wherein:
   the undoped liner/barrier layer of the selected-composition dielectric layers is an undoped silane-based oxide layer and the operation of injecting selected reactants into the chemical vapor deposition chamber includes:
      injecting silane ($SiH_4$) at a flow rate between 190 sccm and 210 sccm;
      injecting nitrous oxide ($N_2O$) at a flow rate between 5700 sccm and 6300 sccm; and
      injecting molecular nitrogen ($N_2$) at a flow rate between 3000 sccm and 3300 sccm.

4. A method according to claim 2 wherein:
   the undoped liner/barrier layer of the selected-composition dielectric layers is an undoped silane-based oxide layer and the operation of injecting selected reactants into the chemical vapor deposition chamber includes:
      injecting silane ($SiH_4$) at a flow rate of approximately 200 sccm;
      injecting nitrous oxide ($N_2O$) at a flow rate of approximately 6000 sccm; and
      injecting molecular nitrogen ($N_2$) at a flow rate of approximately 3150 sccm.

5. A method according to claim 2 wherein:
   the doped gettering layer of the selected-composition dielectric layers is a phosphorus silicate glass layer and the operation of injecting selected reactants into the chemical vapor deposition chamber includes:
      injecting silane ($SiH_4$) at a flow rate between 190 sccm and 210 sccm;
      injecting phosphene ($PH_3$) at a flow rate between 305 sccm and 335 sccm;
      injecting nitrous oxide ($N_2O$) at a flow rate between 5700 sccm and 6300 sccm; and
      injecting molecular nitrogen ($N_2$) at a flow rate between 2550 sccm and 2850 sccm.

6. A method according to claim 2 wherein:
   the doped gettering layer of the selected-composition dielectric layers is a phosphorus silicate glass layer and the operation of injecting selected reactants into the chemical vapor deposition chamber includes:
      injecting silane ($SiH_4$) at a flow rate of approximately 200 sccm;
      injecting phosphene ($PH_3$) at a flow rate of approximately 320 sccm;
      injecting nitrous oxide ($N_2O$) at a flow rate of approximately 6000 sccm; and
      injecting molecular nitrogen ($N_2$) at a flow rate of approximately 2700 sccm.

7. A method according to claim 2 wherein:
   the undoped TEOS-based oxide layer of the selected-composition dielectric layers is formed by injecting selected reactants into the chemical vapor deposition chamber including:
      injecting TEOS at a flow rate between 1.6 ml/min. and 2.0 ml/min.;
      injecting molecular oxygen ($O_2$) at a flow rate between 6200 sccm and 6800 sccm.

8. A method according to claim 2 wherein:
   the undoped TEOS-based oxide layer of the selected-composition dielectric layers is formed by injecting selected reactants into the chemical vapor deposition chamber including:
      injecting TEOS at a flow rate of approximately 1.8 ml/min.;
      injecting molecular oxygen ($O_2$) at a flow rate of approximately 6500 sccm.

9. A method according to claim 2 wherein:
the operation of depositing a plurality of selected-composition dielectric layers on the substrate in-situ in the chemical vapor deposition chamber is performed at a pressure in a range between 2.0 torr and 2.4 torr and at a temperature of approximately 400 degrees Celsius.

10. A method according to claim 2 wherein:
the operation of depositing a plurality of selected-composition dielectric layers on the substrate in-situ in the chemical vapor deposition chamber is performed at a pressure of approximately 2.2 torr and at a temperature of approximately 400 degrees Celsius.

11. A method according to claim 2, wherein the chemical vapor deposition chamber is a plasma-etch chemical vapor deposition (PECVD) chamber.

12. A method according to claim 2 wherein:
the wafer temperature soaking operation includes heating the substrate before reactant gases, power and pressure are applied to the chemical vapor deposition chamber.

13. A method according to claim 6 wherein:
the wafer temperature soaking operation includes heating the substrate before reactant gases, power and pressure are applied to the chemical vapor deposition chamber for approximately a minute.

14. A method of fabricating an integrated circuit comprising:
precoating an inner surface of a the chemical vapor deposition (CVD) reactor;
placing a substrate within the chemical vapor deposition reactor;
wafer temperature soaking a substrate within the chemical vapor deposition reactor; and
depositing a multiple-layer, multiple-composition type dielectric on the substrate in-situ within the chemical vapor deposition reactor in a sequence of reactant-flow steps while the substrate remains within the chemical vapor deposition reactor, the layers including:
an undoped silane-based oxide layer;
a doped gettering layer; and
a TEOS-based oxide layer; and
chemical-mechanical polishing the TEOS-based oxide layer without exposing the doped gettering laver.

15. A method according to claim 14 wherein:
the doped gettering layer is a phosphorus silicate glass layer.

16. A method according to claim 14 wherein the operation of depositing the multiple-layer, multiple-composition type dielectric further comprises:
injecting a plurality of reactants into the chemical vapor deposition reactor at controlled times for controlled durations; and
controlling power, pressure and temperature applied to the chemical vapor deposition reactor during the injection of the plurality of reactants.

17. A method according to claim 14 wherein:
the wafer temperature soaking operation includes heating the substrate before reactant gases, power and pressure are applied to the chemical vapor deposition chamber.

18. A method according to claim 14 wherein:
the wafer temperature soaking operation includes heating the substrate before reactant gases, power and pressure are applied to the chemical vapor deposition chamber for approximately 60 seconds.

19. A method of depositing a premetal interlayer dielectric on a substrate using a PECVD reactor comprising:
depositing a plurality of layers of a premetal dielectric in in-situ deposition upon the semiconductor substrate using the PECVD reactor with each subsequent layer being deposited after a previous layer with no intervening handling, the layers including:
an undoped silane-based oxide layer;
a doped gettering layer; and
a TEOS-based oxide layer; and
chemical mechanical polishing the TEOS-based oxide laver without exposing the doped gettering laver.

20. A method according to claim 19 wherein:
depositing the plurality of layers of premetal dielectric deposits individual selectedcomposition dielectric layers includes operations of:
injecting selected reactants into the chemical vapor deposition chamber at a controlled flow rate, pressure, temperature, and RF power, the injecting step being performed for a controlled duration at the end of which a subsequent selected-composition dielectric layer is deposited without removal of the substrate from the chemical vapor deposition chamber.

21. A method according to claim 19 wherein:
the doped gettering layer is a phosphorus silicate glass layer.

22. A method of depositing a premetal interlayer dielectric on a substrate comprising:
utilizing a PECVD reactor; and
depositing a plurality of layers of a premetal dielectric in in-situ deposition upon the semiconductor substrate using the PECVD reactor with each subsequent layer being deposited after a previous layer with no intervening handling step the plurality of layers including:
an undoped liner/barrier layer;
a doped gettering layer; and
an undoped oxide layer; and
polishing the undoped oxide layer without exposing the doped gettering layer.

23. A method according to claim 22wherein:
depositing the plurality of layers of premetal dielectric deposits individual selected-composition dielectric layers includes operations of:
injecting selected reactants into the chemical vapor deposition chamber at a controlled flow rate, pressure, temperature, and RF power, the injecting step being performed for a controlled duration at the end of which a subsequent selected-composition dielectric layer is deposited without removal of the substrate from the chemical vapor deposition chamber.

24. A method according to claim 28 wherein:
the undoped liner/barrier layer is an undoped silane-based oxide layer;
the doped gettering laver is a phosphorus silicate glass layer; and
the undoped oxide layer is a TEOS-based oxide layer.

* * * * *